United States Patent
Malinin

(10) Patent No.: US 9,413,241 B1
(45) Date of Patent: Aug. 9, 2016

(54) SELF-POWERED BJT DRIVER FOR POWER SUPPLIES

(71) Applicant: Dialog Semiconductor Inc., Campbell, CA (US)

(72) Inventor: Andrey B. Malinin, Fort Collins, CO (US)

(73) Assignee: Dialog Semiconductor Inc., Campbell, CA (US)

( * ) Notice: Subject to any disclaimer, the term of this patent is extended or adjusted under 35 U.S.C. 154(b) by 27 days.

(21) Appl. No.: 14/598,168

(22) Filed: Jan. 15, 2015

(51) Int. Cl.
*H03B 1/00* (2006.01)
*H02M 3/158* (2006.01)

(52) U.S. Cl.
CPC ..................................... *H02M 3/158* (2013.01)

(58) Field of Classification Search
None
See application file for complete search history.

(56) References Cited

U.S. PATENT DOCUMENTS

| | | | | |
|---|---|---|---|---|
| 4,547,686 A * | 10/1985 | Chen | .................... | H03K 17/567 327/374 |
| 5,528,192 A * | 6/1996 | Agiman | ............. | H03K 19/0136 326/17 |
| 6,255,890 B1 * | 7/2001 | Aiello | .................. | H03K 17/567 327/432 |
| 7,053,678 B2 * | 5/2006 | Scollo | .................. | H03K 17/567 327/108 |
| 7,449,935 B2 * | 11/2008 | Scollo | .................. | H03K 17/567 327/374 |
| 2014/0035627 A1 * | 2/2014 | Dunipace | ............... | H03K 3/012 327/109 |
| 2014/0266456 A1 * | 9/2014 | Vice | ..................... | H03G 1/0017 330/291 |
| 2015/0028764 A1 * | 1/2015 | Maru | ....................... | H03K 4/48 315/210 |
| 2015/0028768 A1 * | 1/2015 | Melanson | .......... | H05B 33/0815 315/294 |
| 2015/0162906 A1 * | 6/2015 | Phadke | .................. | H03K 17/60 327/109 |
| 2015/0282262 A1 * | 10/2015 | Lai | ........................ | H05B 37/02 315/200 R |

* cited by examiner

*Primary Examiner* — Lincoln Donovan
*Assistant Examiner* — Khareem E Almo
(74) *Attorney, Agent, or Firm* — Fenwick & West LLP

(57) ABSTRACT

An apparatus for providing auxiliary power to an off-line switcher. The apparatus includes a high voltage semiconductor switch and a driver for the high voltage semiconductor switch. The driver includes a first switch, the first switch coupled to the a third terminal of the high voltage semiconductor switch and to ground, a second switch coupled to a first terminal of the high voltage semiconductor switch, a third switch coupled to the first terminal of the high voltage semiconductor switch and to ground. The driver further includes a diode, the anode of the diode coupled to the third terminal of the high voltage semiconductor switch and the cathode of the diode coupled to the second switch.

27 Claims, 7 Drawing Sheets

SELF-POWERED BJT DRIVER FOR POWER SUPPLIES

BACKGROUND

1. Field of Art

The disclosure generally relates to the field of off-line power supplies, and specifically to providing power for an off-line switcher of an off-line power supply.

2. Description of the Related Art

Off-line power supplies typically use an auxiliary power supply for the control circuitry and the power switchers. Isolated power supplies obtain the auxiliary power from auxiliary transformer windings. However, non-isolated power supplies, where transformers are not used, having a transformer for supplying the auxiliary power is not cost effective.

Typically, non-isolated power supplies use additional circuitry to provide power to the control circuitry and the power switchers. For instance, some off-line power supplies may use a high voltage linear regulator to provide the auxiliary power. Alternatively, other off-line power supplies may use an output voltage bootstrap diode. In many cases, these additional circuitry may use high voltage processes (e.g., 600 V or higher) and/or may be inefficient.

Thus, it would be advantageous to be able to efficiently provide auxiliary power for the control circuitry and the power switchers of an off-line power supply without using a high voltage process.

SUMMARY

An apparatus provides auxiliary power to an off-line switcher. The apparatus includes a high voltage semiconductor switch and a driver for the high voltage semiconductor switch. The driver includes a first switch, the first switch coupled to the a third terminal of the high voltage semiconductor switch and to ground, a second switch coupled to a first terminal of the high voltage semiconductor switch, a third switch coupled to the first terminal of the high voltage semiconductor switch and to ground. The driver further includes a diode, the anode of the diode coupled to the third terminal of the high voltage semiconductor switch and the cathode of the diode coupled to the second switch.

The features and advantages described in the specification are not all inclusive and, in particular, many additional features and advantages will be apparent to one of ordinary skill in the art in view of the drawings and specification. Moreover, it should be noted that the language used in the specification has been principally selected for readability and instructional purposes, and may not have been selected to delineate or circumscribe the inventive subject matter.

BRIEF DESCRIPTION OF DRAWINGS

The disclosed embodiments have other advantages and features which will be more readily apparent from the detailed description, the appended claims, and the accompanying figures (or drawings). A brief introduction of the figures is below.

DETAILED DESCRIPTION

The figures (FIGS.) and the following description relate to preferred embodiments by way of illustration only. It should be noted that from the following discussion, alternative embodiments of the structures and methods disclosed herein will be readily recognized as viable alternatives that may be employed without departing from the principles of what is claimed.

Reference will now be made in detail to several embodiments, examples of which are illustrated in the accompanying figures. It is noted that wherever practicable similar or like reference numbers may be used in the figures and may indicate similar or like functionality. The figures depict embodiments of the disclosed system (or method) for purposes of illustration only. One skilled in the art will readily recognize from the following description that alternative embodiments of the structures and methods illustrated herein may be employed without departing from the principles described herein.

Switch Mode Power Supplies

Switch mode power supplies are power supplies that include a switching regulator to convert electrical power. In a switch mode power supply, a pass transistor switches between low-dissipation, full-on, and full-off states, while spending a small amount of time in the high dissipation state. Switch mode power supplies include an input rectifier and/or filter, a switcher, and an output rectifier and/or filter.

Off-Line Switchers

Figure 1A:
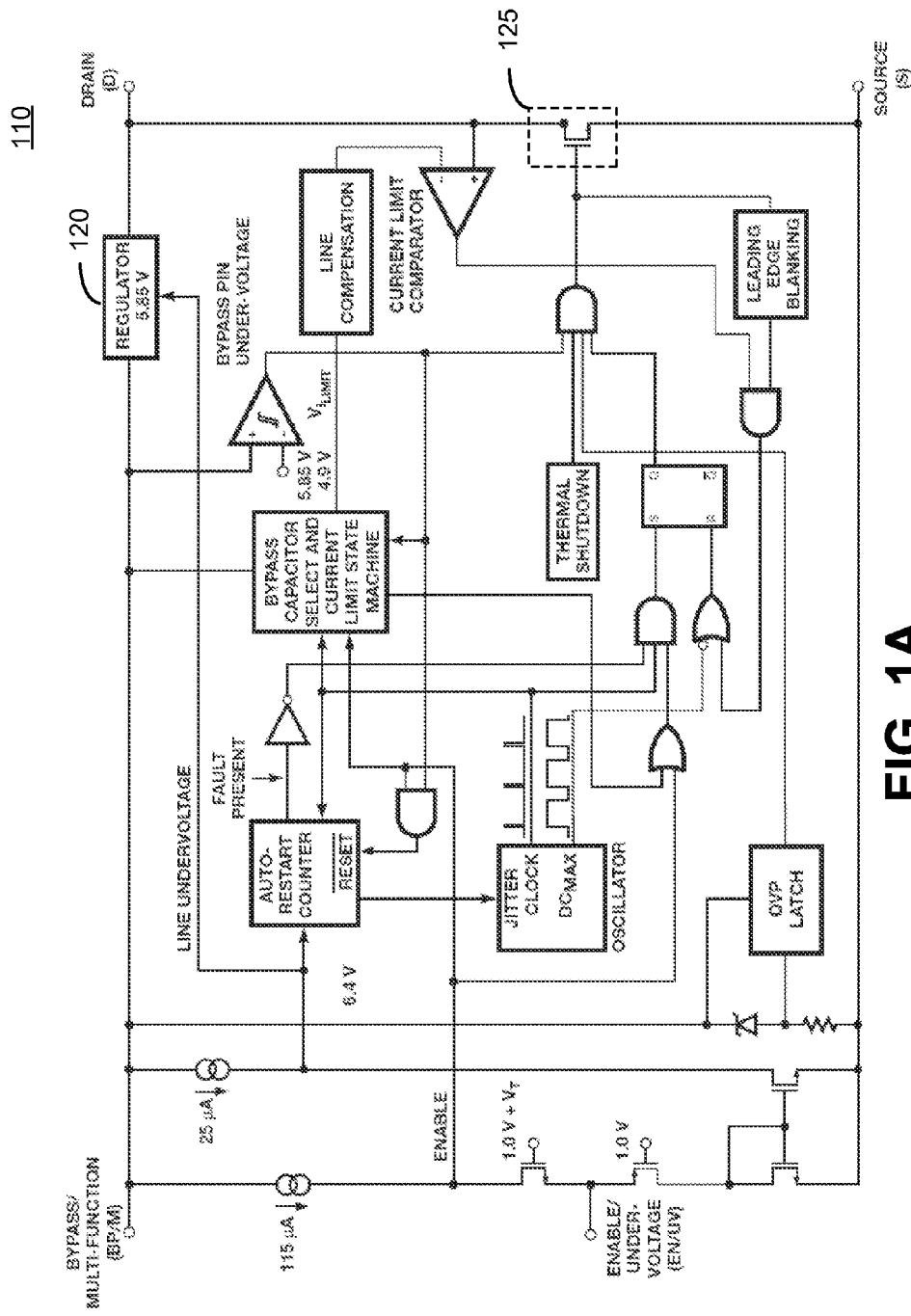
FIG. 1A illustrates a functional block diagram of an off-line switcher with line compensated overload power.
Figure 1B:
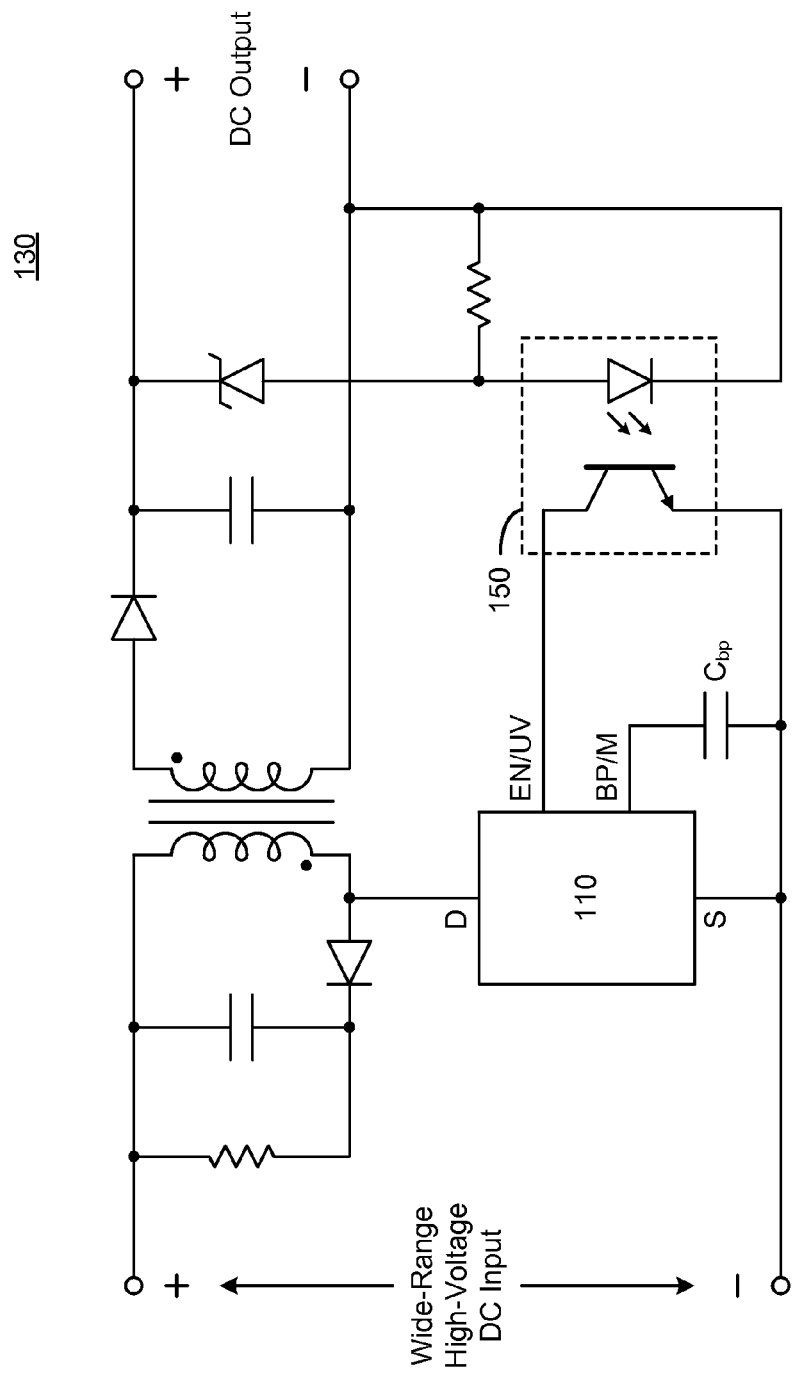
FIG. 1B illustrates a circuit diagram of an application of the off-line switcher of FIG. 1A.

FIG. 1A illustrates a functional block diagram of an off-line switcher 110 with line compensated overload power. FIG. 1B illustrates a circuit diagram of an application of the off-line switcher 110.

The off-line switcher 110 combines a high-voltage power metal-oxide semiconductor field-effect transistor (MOSFET) 125 with a power supply controller in one device. The controller includes a 5.85 V regulator 120 that charges bypass capacitor $C_{bp}$ connected to the BYPASS/MULTI-FUNCTION pin (BP/M). The regulator 120 charges the capacitor $C_{bp}$ by drawing a current form the voltage on the DRAIN pin (D) when the MOSFET 130 is off. The BP/M pin is the internal voltage supply node of off-line switcher 110. When the MOSFET 125 is on, the device operates from the energy stored in the bypass capacitor $C_{bp}$.

FIG. 1B illustrates an off-line power supply 130 using the off-line switcher 110. Off-line power supply 130 receives a wide-range high-voltage DC input voltage (Vin) and generates a DC output voltage (Vout). Bypass capacitor $C_{bp}$ is coupled to the BP/M pin of off-line switcher 110 and optocoupler 150 is coupled to the ENABLE/UNDERVOLTAGE (EN/UV) pin of off-line switcher 110. The EN/UV pin controls the switching power of MOSFET 125. The switching of MOSFET 125 is terminated when a current greater than a threshold current (e.g., 115 μA) is drawn from the EN/UV pin. Switching of MOSFET 125 resumes when the current drawn from the EN/UV pin drops below a threshold current (e.g., 75 μA).

One disadvantage of the off-line switcher 110 is that regulator 120 is inefficient and uses a high voltage process (e.g., 600 V or higher).

Figure 2A:
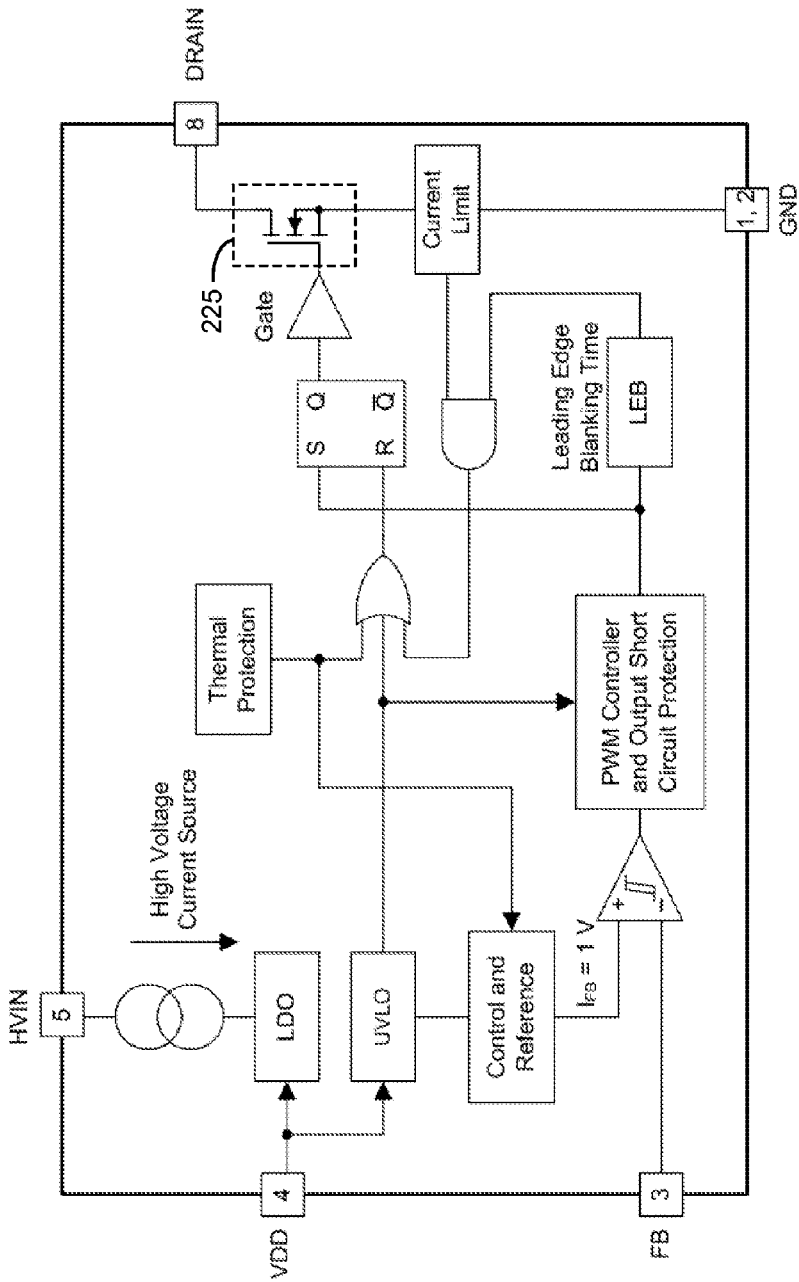
FIG. 2A illustrates a functional block diagram of a low quiescent current off-line switcher.
Figure 2B:
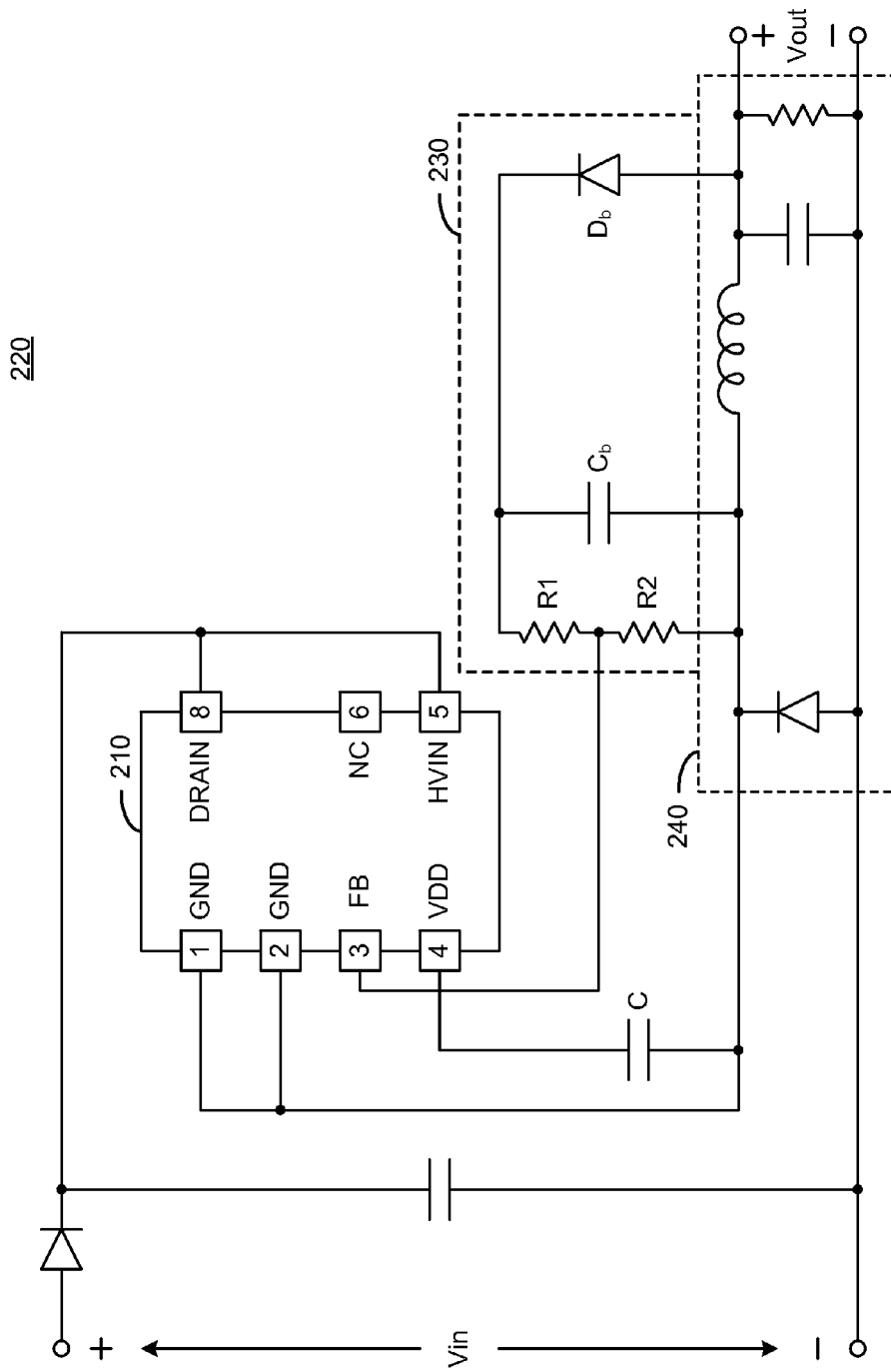
FIG. 2B illustrates a circuit diagram of an application of the off-line switcher of FIG. 2A.

FIG. 2A illustrates a functional block diagram of a low quiescent current off-line switcher 210. FIG. 2B illustrates a circuit diagram of an application of the off-line switcher 210.

The off-line switcher 210 includes a high voltage power MOSFET 225 and a controller in one monolithic device. The device also includes a high-voltage current source, enabling start up and operation directly from the rectified main voltage. The off-line switcher 210 generates an internal low-voltage supply (e.g., 5V) from the integrated high-voltage current source.

The off-line power supply 220 receives an input voltage Vin and generates an output voltage Vout. The off-line power supply 220 includes the off-line switcher 210, a bootstrap circuitry 230, and a load 240. The bootstrap circuitry 230 includes a diode $D_b$, capacitor $C_b$, and resistors R1 and R2. The components of the bootstrap circuitry 230 may use high voltage components. Additionally, the off-line switcher may use a supply voltage different than the output voltage Vout of the off-line power supply 220. During start up, the output voltage Vout may not be high enough to power off-line switcher 210. Additionally, during normal operation of the off-line power supply 220, the output voltage Vout may be higher than the maximum supply voltage of off-line switcher 210.

Figure 3A:
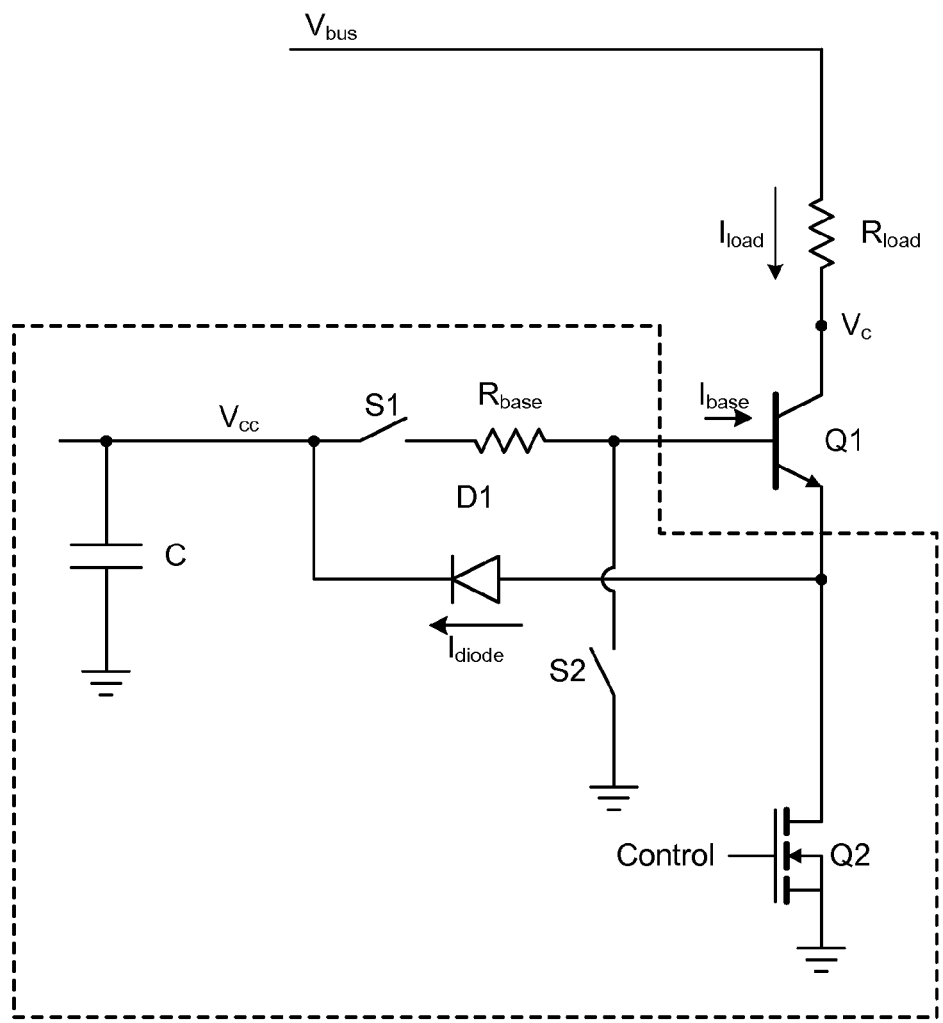
FIG. 3A illustrates a circuit diagram of a high voltage semiconductor switch with a self-powered driver, according to one embodiment.

FIG. 3A illustrates a circuit diagram of a high voltage semiconductor switch Q1 with a self-powered driver 330, according to one embodiment. In the circuit diagram of FIG. 3A, the high voltage semiconductor switch Q1 is a bipolar junction transistor (BJT), but other types of high voltage semiconductor switches, such as metal-oxide-semiconductor field effect transistors (MOSFET) may be used instead.

The emitter of the BJT Q1 is coupled to a switch Q2. In some embodiments, switch Q2 is a field-effect transistor (FET). When closed, switch Q2 couples the emitter of BJT Q1 to ground. The base of BJT Q1 is coupled to a resistor $R_{base}$ and switch S1, and switch S1 is coupled to capacitor C. When closed, switch S1 couples resistor $R_{base}$ and the base of BJT Q1 to capacitor C. In some embodiments, the base of the BJT is coupled to a current source instead of resistor $R_{base}$. The current source supplies current to the base of the BJT to turn the BJT on. The base of BJT Q1 is further coupled to switch S2. When closed, switch S2 couples the base of BJT Q1 to ground.

A diode D1 is coupled between the emitter of BJT Q1 and capacitor C. When forward biased, diode D1 charges capacitor C. In some embodiments, a diode connected transistor is coupled between the emitter of the BJT Q1 and capacitor C instead of a diode. For instance, a diode connected BJT, where the base and the collector of the diode connected BJT are connected to each other is used. Alternatively, a diode connected MOSFET, where the gate and the drain of the diode connected MOSFET are connected to each other is used.

In some embodiments a load is coupled between the collector of BJT Q1 and a supply voltage $V_{bus}$. In the circuit diagram of FIG. 3C, the load is represented as a load resistor $R_{load}$ but any other types of loads may be coupled between the collector of the BJT Q1 and power supply $V_{bus}$. In some embodiments, a load is coupled between the ground of the driver 330 and a negative terminal of a power supply (not shown).

In some embodiments, a field effect transistor FET is used instead of BJT Q1. In this embodiment, the source of FET Q1 is coupled to switch Q2, and the gate of FET Q1 is coupled to resistor $R_{base}$ and switch S1. Additionally, a load, such as $R_{load}$, may be coupled to the drain of FET Q1.

In some embodiments, every element of FIG. 3A is fabricated in a monolithic integrated circuit. In other embodiments, some components, such as, the load, BJT Q1 and/or capacitor C are provided as an external component to the integrated circuit. That is, switches Q2, S1, and S2, diode D1, and resistors $R_{base}$ are fabricated in a single integrated circuit and load resistor $R_{load}$, BJT Q1 and capacitor C are external to the integrated circuit. In yet other embodiments, every component is a discrete circuit element and the components are integrated using a printed circuit board (PCB).

In some embodiments, additional circuitry is included to generate the control signals to close and open switches Q2, S1, and S2. In other embodiments, the control signals are generated by an external component. In one embodiment, feedback is used to generate the control signals. For instance, the amount of charge stored in capacitor C of self-powered driver 330 may be sensed and the control signals to close and open switches Q2, S1, and S2 may be generated based on the sensed amount of charge stored in capacitor C.

Figure 3B:
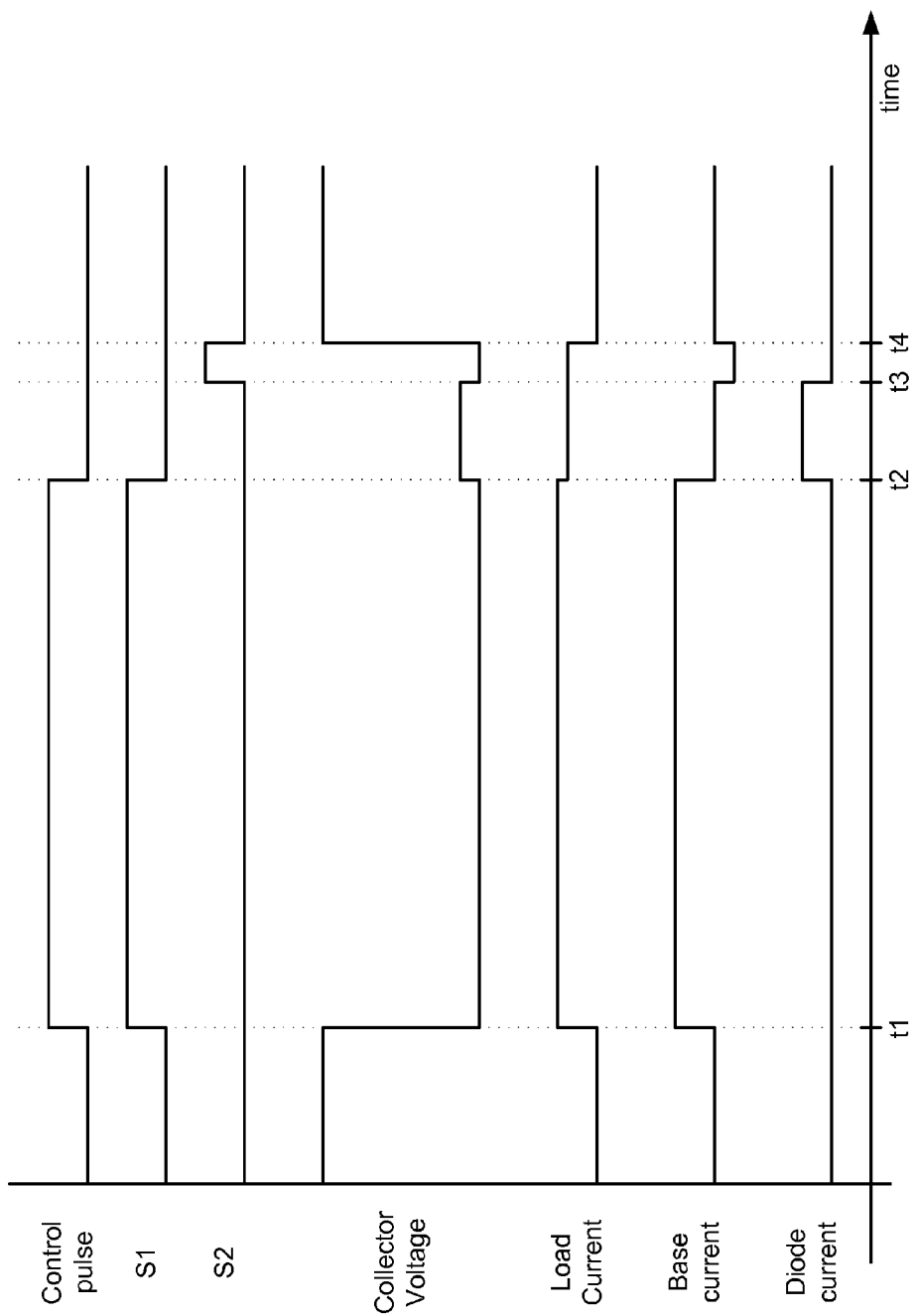
FIG. 3B illustrates a timing diagram of various signals of the self-powered driver of FIG. 3A, according to one embodiment.

FIG. 3B illustrates a timing diagram of various signals of the self-powered driver 330, according to one embodiment. At time t1 switches Q2 and S1 are closed. Switch Q2 couples the emitter of BJT Q1 to ground and switch S1 couples the base of BJT Q1 to capacitor C. When switches Q2 and S1 are closed, BJT Q1 turns on and a load current $I_{load}$ starts flowing through resistor $R_{load}$ and BJT Q1. Current $I_{load}$ generates a voltage difference across resistor $R_{load}$ reducing the collector voltage V.

At time t2, switches Q2 and S1 are opened. Since switch Q2 is closed, current $I_{load}$ is not able to flow to ground through switch Q2 and thus, forward biases diode D1. Diode D1 conducts current $I_{diode}$ into capacitor C, thus, charging capacitor C.

At time t3, switch S2 is closed. Switch S2 couples the base of BJT Q1 to ground, turning off BJT Q1. In some embodiments, switch S2 discharges a base capacitor of BJT Q1. As a result, the base current $I_{base}$ is negative until the base capacitor is discharged.

At time t4, switch S2 is opened. Since all switches Q2, S1, and S2 are opened, BJT Q1 remains off until switches Q2 and S1 are closed in a subsequent operating cycle.

Figure 3C:
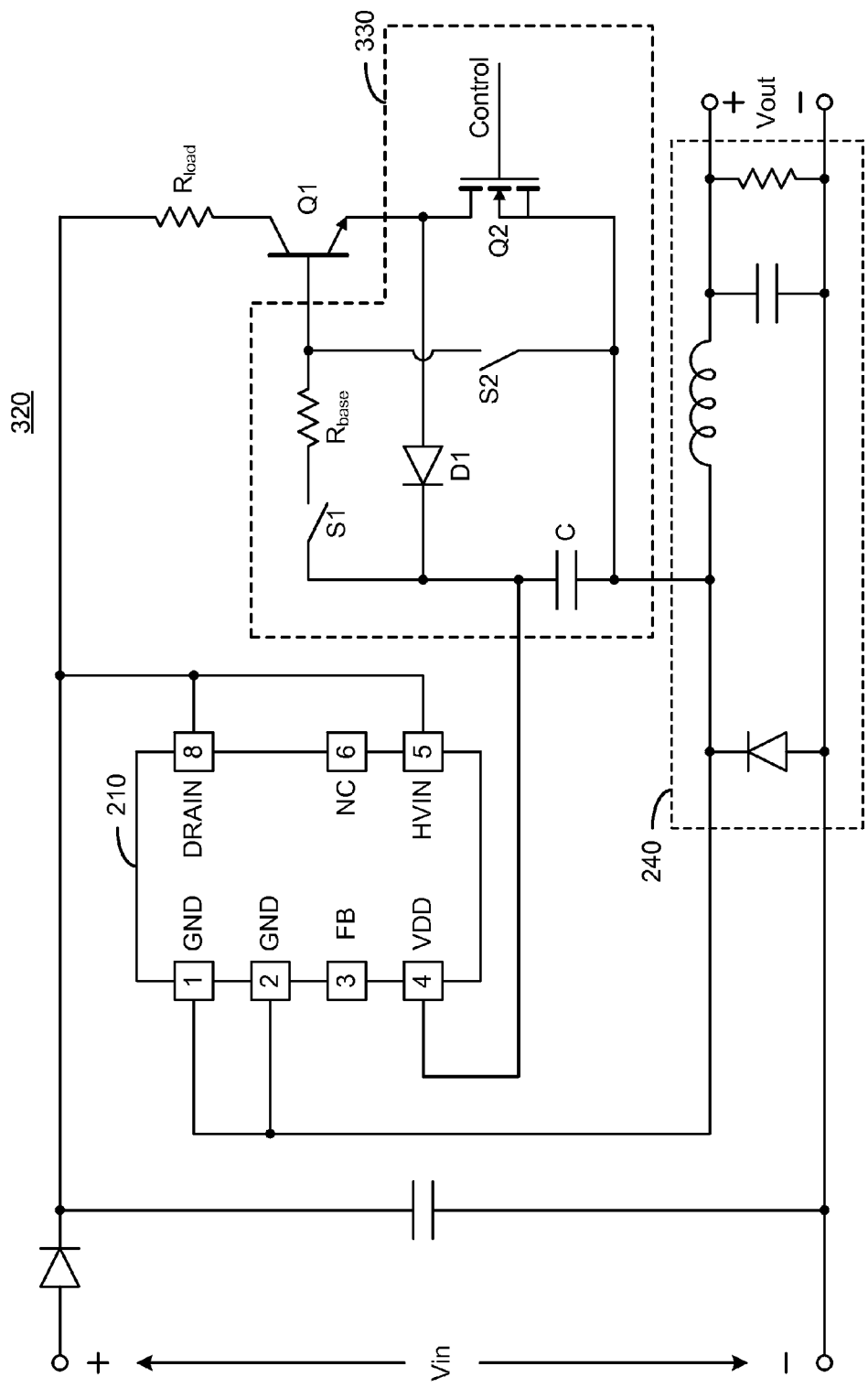
FIG. 3C illustrates an exemplary application of the self-powered driver of FIG. 3A, according to one embodiment.

FIG. 3C illustrates an exemplary application of the self-powered driver 330. The exemplary application of FIG. 3C uses a buck configuration, but other configurations, such as, a boost configuration, a buck-boost configuration, a flyback configuration, or any other power supply configuration may be used instead.

FIG. 3C is a circuit diagram of a switch-mode power supply 320. Switch-mode power supply 320 receives an input voltage Vin and generates an output voltage Vout. Switch-mode power supply 320 includes an off-line switcher 210, a load 240, load resistor $R_{load}$, BJT Q1, and a self-powered driver 330. The self-powered driver 330 provides power for driving the off-line switcher 210.

In some embodiments, additional circuitry, such as feedback circuitry may be included. The feedback circuitry may be connected to the FB terminal of the off-line switcher 210.

The self-powered driver 330 receives a supply voltage from the input of the switch-mode power supply 320 and charges capacitor C to power the off-line switcher 210.

Additional Configuration Considerations

Throughout this specification, plural instances may implement components, operations, or structures described as a single instance. Although individual operations of one or more methods are illustrated and described as separate operations, one or more of the individual operations may be performed concurrently, and nothing requires that the operations be performed in the order illustrated. Structures and functionality presented as separate components in example configurations may be implemented as a combined structure or component. Similarly, structures and functionality presented as a single component may be implemented as separate components. These and other variations, modifications, additions, and improvements fall within the scope of the subject matter herein.

Certain embodiments are described herein as including logic or a number of components, modules, or mechanisms. Modules may constitute either software modules (e.g., code embodied on a machine-readable medium or in a transmission signal) or hardware modules. A hardware module is tangible unit capable of performing certain operations and may be configured or arranged in a certain manner. In example embodiments, one or more computer systems (e.g., a standalone, client or server computer system) or one or more hardware modules of a computer system (e.g., a processor or a group of processors) may be configured by software (e.g., an application or application portion) as a hardware module that operates to perform certain operations as described herein.

In various embodiments, a hardware module may be implemented mechanically or electronically. For example, a hardware module may comprise dedicated circuitry or logic that is permanently configured (e.g., as a special-purpose processor, such as a field programmable gate array (FPGA) or an application-specific integrated circuit (ASIC)) to perform certain operations. A hardware module may also comprise programmable logic or circuitry (e.g., as encompassed within a general-purpose processor or other programmable processor) that is temporarily configured by software to perform certain operations. It will be appreciated that the decision to implement a hardware module mechanically, in dedicated and permanently configured circuitry, or in temporarily configured circuitry (e.g., configured by software) may be driven by cost and time considerations.

The various operations of example methods described herein may be performed, at least partially, by one or more processors that are temporarily configured (e.g., by software) or permanently configured to perform the relevant operations. Whether temporarily or permanently configured, such processors may constitute processor-implemented modules that operate to perform one or more operations or functions. The modules referred to herein may, in some example embodiments, comprise processor-implemented modules.

The one or more processors may also operate to support performance of the relevant operations in a "cloud computing" environment or as a "software as a service" (SaaS). For example, at least some of the operations may be performed by a group of computers (as examples of machines including processors), these operations being accessible via a network (e.g., the Internet) and via one or more appropriate interfaces (e.g., application program interfaces (APIs).)

The performance of certain of the operations may be distributed among the one or more processors, not only residing within a single machine, but deployed across a number of machines. In some example embodiments, the one or more processors or processor-implemented modules may be located in a single geographic location (e.g., within a home environment, an office environment, or a server farm). In other example embodiments, the one or more processors or processor-implemented modules may be distributed across a number of geographic locations.

Some portions of this specification are presented in terms of algorithms or symbolic representations of operations on data stored as bits or binary digital signals within a machine memory (e.g., a computer memory). These algorithms or symbolic representations are examples of techniques used by those of ordinary skill in the data processing arts to convey the substance of their work to others skilled in the art. As used herein, an "algorithm" is a self-consistent sequence of operations or similar processing leading to a desired result. In this context, algorithms and operations involve physical manipulation of physical quantities. Typically, but not necessarily, such quantities may take the form of electrical, magnetic, or optical signals capable of being stored, accessed, transferred, combined, compared, or otherwise manipulated by a machine. It is convenient at times, principally for reasons of common usage, to refer to such signals using words such as "data," "content," "bits," "values," "elements," "symbols," "characters," "terms," "numbers," "numerals," or the like. These words, however, are merely convenient labels and are to be associated with appropriate physical quantities.

Unless specifically stated otherwise, discussions herein using words such as "processing," "computing," "calculating," "determining," "presenting," "displaying," or the like may refer to actions or processes of a machine (e.g., a computer) that manipulates or transforms data represented as physical (e.g., electronic, magnetic, or optical) quantities within one or more memories (e.g., volatile memory, non-volatile memory, or a combination thereof), registers, or other machine components that receive, store, transmit, or display information.

As used herein any reference to "one embodiment" or "an embodiment" means that a particular element, feature, structure, or characteristic described in connection with the embodiment is included in at least one embodiment. The appearances of the phrase "in one embodiment" in various places in the specification are not necessarily all referring to the same embodiment.

Some embodiments may be described using the expression "coupled" and "connected" along with their derivatives. For example, some embodiments may be described using the term "coupled" to indicate that two or more elements are in direct physical or electrical contact. The term "coupled," however, may also mean that two or more elements are not in direct contact with each other, but yet still co-operate or interact with each other. The embodiments are not limited in this context.

As used herein, the terms "comprises," "comprising," "includes," "including," "has," "having" or any other variation thereof, are intended to cover a non-exclusive inclusion. For example, a process, method, article, or apparatus that comprises a list of elements is not necessarily limited to only those elements but may include other elements not expressly listed or inherent to such process, method, article, or apparatus. Further, unless expressly stated to the contrary, "or" refers to an inclusive or and not to an exclusive or. For example, a condition A or B is satisfied by any one of the following: A is true (or present) and B is false (or not present), A is false (or not present) and B is true (or present), and both A and B are true (or present).

In addition, use of the "a" or "an" are employed to describe elements and components of the embodiments herein. This is done merely for convenience and to give a general sense of the invention. This description should be read to include one or at least one and the singular also includes the plural unless it is obvious that it is meant otherwise.

Upon reading this disclosure, those of skill in the art will appreciate still additional alternative structural and functional designs for a system and a process for providing an auxiliary power supply to off-line switchers in an off-line power supply through the disclosed principles herein. Thus, while particular embodiments and applications have been illustrated and described, it is to be understood that the disclosed embodiments are not limited to the precise construction and components disclosed herein. Various modifications, changes and variations, which will be apparent to those skilled in the art, may be made in the arrangement, operation, and details of the method and apparatus disclosed herein without departing from the spirit and scope defined in the appended claims.

What is claimed is:

1. An apparatus comprising:
 a high voltage semiconductor switch, the high voltage semiconductor switch including a first terminal, a second terminal, and an third terminal; and
 a driver comprising:
  a first switch coupled to the third terminal of the high voltage semiconductor switch and to ground, the first switch turning on and off based on a first control signal;
  a second switch coupled to the first terminal of the high voltage semiconductor switch, the second switch turning on and off based on the first control signal;
  a third switch coupled to the first terminal of the high voltage semiconductor switch and to ground, the third switch turning on and off based on the a second control signal; and
  a diode, the diode including an anode terminal and a cathode terminal, the anode terminal of the diode coupled to the third terminal of the high voltage semiconductor switch, and the cathode terminal of the diode coupled to the second switch.

2. The apparatus of claim 1, wherein the high voltage semiconductor switch is a bipolar junction transistor (BJT), wherein the first terminal of the high voltage semiconductor switch is a base terminal of the BJT, the second terminal of the high voltage semiconductor switch is a collector terminal of the BJT, and the third terminal of the high voltage semiconductor switch is a emitter terminal of the BJT.

3. The apparatus of claim 1, wherein the high voltage semiconductor switch is a field effect transistor (FET), wherein the first terminal of the high voltage semiconductor switch is a gate terminal of the FET, the second terminal of the high voltage semiconductor switch is a drain terminal of the FET, and the third terminal of the high voltage semiconductor switch is a source terminal of the FET.

4. The apparatus of claim 1, wherein the driver further comprises:
 a base resistor coupled between the second switch and the first terminal of the high voltage semiconductor switch.

5. The apparatus of claim 1, wherein the driver further comprises:
 a current source coupled to the first terminal of the high voltage semiconductor switch.

6. The apparatus of claim 1 further comprising:
 a load, a first terminal of the load coupled to the second terminal of the high voltage semiconductor switch and a second terminal of the load coupled to a power supply.

7. The apparatus of claim 1 further comprising:
 a load, a first terminal of the load coupled to ground and a second terminal of the load coupled to a power supply.

8. The driver of claim 1 further comprising:
 a capacitor coupled to the cathode terminal of the diode.

9. The driver of claim 8, wherein the capacitor is further coupled to a supply terminal of an off-line switcher.

10. The driver of claim 1, wherein the first switch is a field-effect transistor (FET).

11. The driver of claim 1, wherein the diode is a diode connected transistor.

12. A driver for power supplies comprising:
 a first switch, the first switch turning on and off based on a first control signal, the first switch including a first terminal and a second terminal, the first terminal of the first switch coupled to ground;
 a diode, the diode including an anode terminal and a cathode terminal, the anode terminal of the diode coupled to the second terminal of the first switch;
 a second switch, the second switch turning on and off based on the first control signal, the second switch including a first terminal and a second terminal, the first terminal of the second switch coupled to the cathode terminal of the diode;
 a third switch, the third switch turning on and off based on the a second control signal, the third switch including a first terminal and a second terminal, the first terminal of the third switch coupled to the second terminal of the second switch, and the second terminal of the third switch coupled to ground.

13. The driver of claim 12 further comprising:
 a base resistor coupled in between the second terminal of the second switch and the first terminal of the third switch.

14. The driver of claim 12 further comprising:
 a current source coupled to the first terminal of the high voltage semiconductor switch.

15. The driver of claim 12, wherein the first switch is a field-effect transistor (FET).

16. The driver of claim 12 further comprising:
 a bipolar junction transistor (BJT), the BJT including a base terminal, an emitter terminal, and a collector terminal, the base terminal of the BJT coupled to the first terminal of the third switch, and the emitter terminal of the BJT coupled to the second terminal of the first switch.

17. The driver of claim 12 further comprising:
 a field effect transistor (FET), the FET including a gate terminal, a source terminal, and a drain terminal, the gate terminal of the FET coupled to the first terminal of the third switch, the source of the FET coupled to the second terminal of the first switch.

18. The driver of claim 12 further comprising:
 a capacitor coupled to the cathode terminal of the diode.

19. The driver of claim 18, wherein the capacitor is further coupled to a supply terminal of an off-line switcher.

20. A method for controlling a driver for power supplies comprising:
 closing a first switch and a second switch, the first switch coupled to a third terminal of a high voltage semiconductor switch, and the second switch coupled to a first terminal of the high voltage semiconductor switch;
 responsive to closing the first switch and the second switch, turning on the high voltage semiconductor switch;
 opening the first switch and the second switch;
 responsive to opening the first switch and the second switch, turning on a diode, an anode of the diode coupled to the third terminal of the high voltage semiconductor switch, and a cathode of the diode coupled to a capacitor, the diode charging the capacitor;
 closing a third switch, the third switch coupling the first terminal of the high voltage semiconductor switch to ground;

responsive to closing the third switch, turning off the high voltage semiconductor switch.

21. The method of claim 20, wherein the high voltage semiconductor switch is a bipolar junction transistor (BJT), wherein the first terminal of the high voltage semiconductor switch is a base terminal of the BJT, a second terminal of the high voltage semiconductor switch is a collector terminal of the BJT, and the third terminal of the high voltage semiconductor switch is a emitter terminal of the BJT.

22. The method of claim 20, wherein the high voltage semiconductor switch is a field effect transistor (FET), wherein the first terminal of the high voltage semiconductor switch is a gate terminal of the FET, the second terminal of the high voltage semiconductor switch is a drain terminal of the FET, and the third terminal of the high voltage semiconductor switch is a source terminal of the FET.

23. The method of claim 20, wherein the first switch is a field-effect transistor (FET).

24. The method of claim 20, wherein the third switch is closed after the capacitor is charged to a threshold voltage.

25. The method of claim 20, further comprising:
responsive to turning off the high voltage semiconductor switch, turning off the diode.

26. The method of claim 20, further comprising:
responsive to closing the third switch, discharging a base capacitance, wherein the base capacitance is an intrinsic capacitance of the high voltage semiconductor switch at the first terminal of the high voltage semiconductor switch.

27. The method of claim 26, further comprising:
responsive to discharging the base capacitance, opening the third switch.

\* \* \* \* \*